(12) United States Patent
Wang et al.

(10) Patent No.: US 6,447,929 B1
(45) Date of Patent: Sep. 10, 2002

(54) THIN COPPER ON USABLE CARRIER AND METHOD OF FORMING SAME

(75) Inventors: Jiangtao Wang, Cleveland Heights; Dan Lillie, Bedford; Sidney J. Clouser, Chardon, all of OH (US)

(73) Assignee: Gould Electronics Inc., Eastlake, OH (US)

( * ) Notice: Subject to any disclaimer, the term of this patent is extended or adjusted under 35 U.S.C. 154(b) by 96 days.

(21) Appl. No.: 09/649,922

(22) Filed: Aug. 29, 2000

(51) Int. Cl.[7] ................... B32B 15/08; B32B 15/20; H05K 1/09; H05K 3/38; C25D 7/06
(52) U.S. Cl. .............. 428/604; 428/612; 428/626; 428/666; 428/674; 205/111; 205/178; 205/182; 156/233; 156/247
(58) Field of Search .................. 428/607, 612, 428/626, 674, 675, 666, 935; 205/111, 182, 178, 76, 77; 156/233, 247

(56) References Cited

U.S. PATENT DOCUMENTS

| | | | |
|---|---|---|---|
| 3,293,109 A | 12/1966 | Luce et al. | 161/166 |
| 3,969,199 A | 7/1976 | Berdan et al. | 204/33 |
| 3,984,598 A | 10/1976 | Sarazin et al. | 428/336 |
| 3,998,601 A | 12/1976 | Yates et al. | 29/195 |
| 4,088,544 A | 5/1978 | Hutkin | 204/12 |
| 4,293,617 A | 10/1981 | Nagy | 428/469 |
| 4,357,395 A * | 11/1982 | Lifshin et al. | 156/233 |
| 4,398,993 A * | 8/1983 | Hume et al. | 134/22.19 |
| 5,114,543 A | 5/1992 | Kajiwara et al. | 205/152 |
| 5,167,997 A | 12/1992 | Chamberlain et al. | 428/76 |
| 5,210,590 A | 5/1993 | Landa et al. | 356/319 |
| 5,262,247 A | 11/1993 | Kajiwara et al. | 428/607 |
| 5,322,975 A | 6/1994 | Nagy et al. | 174/257 |
| 5,366,814 A * | 11/1994 | Yamanishi et al. | 205/111 |
| 5,674,596 A | 10/1997 | Johnston | 428/209 |
| 5,725,937 A | 3/1998 | Johnston | 428/209 |
| 6,117,300 A * | 9/2000 | Carbin et al. | 156/151 |
| 6,183,880 B1 * | 2/2001 | Yoshioka et al. | 148/264 |
| 6,270,889 B1 * | 8/2001 | Kataoka et al. | 156/289 |
| 6,319,620 B1 * | 11/2001 | Kataoka et al. | 174/255 |
| 6,346,335 B1 * | 2/2002 | Chen et al. | 428/336 |

* cited by examiner

Primary Examiner—John J. Zimmerman
(74) Attorney, Agent, or Firm—Mark Kusner; Michael A. Jaffe

(57) ABSTRACT

A component for use in forming a printed circuit board comprised of a copper foil, a layer of chromium chemically deposited thereon, the layer of chromium having a thickness of less than about 0.10 μm; and a layer of electrodeposited copper on the layer of chromium, the layer of electrodeposited copper having a thickness of less than 35 μm. A nodular treatment layer is provided on the copper foil and the layer of electrodeposited copper.

22 Claims, 3 Drawing Sheets

THIN COPPER ON USABLE CARRIER AND METHOD OF FORMING SAME

FIELD OF THE INVENTION

The present invention relates generally to printed circuits, and more specifically, to components employed in the manufacturing of printed circuit boards.

BACKGROUND OF THE INVENTION

In recent years, printed circuit components have become widely used in a variety of electronic devices. Of particular interest are multi-layer, printed circuit board components that have been developed to meet the demand for miniaturization of electronic components and the need for printed circuit boards having a high density of electrical interconnections and circuitry. In the manufacture of printed circuit boards, conductive foils (which are usually copper foils) are secured to a core that is conventionally a reinforced or non-reinforced dielectric. (Throughout this specification, the use of the term "core" is meant to include any one of a variety of core materials, all of which may be reinforced or non-reinforced and may include an epoxy, polyester, polyimide, a polytetrafloroethylene, and in some applications, a core material which includes previously formed printed circuits). The process of forming the printed circuits includes one or more etching steps in which the undesired or unwanted copper is removed by etching away portions of the conductive foil from the component surface to leave a distinct pattern of conductive lines and elements on the surface of the etched component. The etched component and other component materials may then be packaged together to form a multi-layer circuit board package. Additional processing, such as hole drilling and component attaching, will eventually complete the printed circuit board product.

The trend in recent years has been to reduce the size of electronic components and provide printed circuit boards having, as one example, multi-chip modules. This results in a need to increase the density of components, such as surface-mount components, provided on the printed circuit board. This in turn results in a so-called "densely populated" or simply "dense" printed circuit board.

A key to providing a densely populated printed circuit board is to produce close and fine circuit patterns on the outer surfaces (i.e., the exposed surfaces) of the resulting multi-layer printed circuit board. The width and spacing of conductive paths on a printed circuit board are generally dictated by the thickness of the copper layer used thereon. For example, if the copper layer has a thickness of 35 $\mu$m (which is a conventional 1-ounce foil used in the manufacture of many printed circuits), exposing the printed circuit board to an etching process for a period of time to remove such a foil thickness will also reduce the width of the side areas of the printed circuit path by approximately one-half to one-third. In other words, a printed circuit board must be designed to take into account the original thickness of the copper and that an etching process will also eat away the sides of a circuit path (i.e., undercut a masking material). Thus, the thickness of the circuit lines, and the spacing therebetween, is basically limited by the thickness of the copper used on the outer surface of the multi-layer printed circuit board. To produce "densely populated" printed circuit boards, it is therefore necessary to reduce the thickness of the copper, at least on the outermost surface of a multi-layer printed circuit package. The thickness of the copper foil sheet is generally limited by the ability of a foil manufacturer to handle and transport such sheets. In this respect, as the thickness of the foil decreases below 35 $\mu$m, the ability to physically handle such foil becomes more difficult.

The present invention overcomes this and other problems and provides a use in components for forming printed circuit boards, wherein the component has an extremely thin copper layer on a support layer, wherein both layers are usable in forming printed circuits.

SUMMARY OF THE INVENTION

In accordance with the present invention, there is provided a component for use in forming a printed circuit board. The component is comprised of a copper foil having a layer of a chromium-containing material deposited thereon. The layer of chromium-containing material has a thickness of up to about 0.10 $\mu$m. A layer of electrodeposited copper is provided on the layer of chromium. The layer of electrodeposited copper has a thickness of less than 35 $\mu$m. A nodular treatment is applied to the copper foil and to the electrodeposited copper.

In accordance with another aspect of the present invention, there is provided a component for use in forming a printed circuit board, comprised of a copper foil and a metal-containing release layer on one surface of the copper foil. The metal-containing release layer has a thickness of up to about 0.10 $\mu$m. A layer of copper is electrodeposited on the metal-containing release layer, the layer of electrodeposited copper having a thickness of less than about 35 $\mu$m. A nodular treatment is applied to the copper foil and to the electrodeposited copper.

In accordance with another aspect of the present invention, there is provided a method of forming a component for use in manufacturing printed circuits comprising the steps of:

cleaning one surface of a copper foil by exposing a surface of a copper foil to an acid solution to remove oxide film from the surface;

rinsing the surface of the copper foil to remove residual acid solution;

electrolytically depositing a layer of chromium on the surface of the copper foil, the layer of chromium being less than about 0.10 $\mu$m;

cleaning the layer of chromium;

electrodepositing a layer of copper on the chromium layer, the layer of copper having a thickness less than about 35 $\mu$m; and applying a nodular treatment layer to the copper foil and to the layer of copper.

In accordance with another aspect of the present invention, there is provided a method of forming printed circuits, comprising the steps of:

(a) applying a metal-containing release layer that is less than about 0.10 $\mu$m onto a clean surface of a copper foil;

(b) electrodepositing a layer of copper that is less than about 35 $\mu$m onto the metal-containing release layer;

(c) applying a nodular treatment layer to the copper foil and to the layer of copper.

(d) bonding the copper foil to a first prepreg layer and the layer of copper to a second prepreg layer; and (e) separating the prepreg layers such that the copper foil separates from the layer of copper along the metal-containing release layer.

It is an object of the present invention to provide a flexible component for use in forming printed circuits.

Another object of the present invention is to provide a component for use in forming a printed circuit, wherein the component has an exceptionally thin layer of copper mounted onto a support layer of copper.

Another object of the present invention is to provide a component as described above wherein both layers of copper are usable in forming a printed circuit.

A still further object of the present invention is to provide a component as described above wherein both layers of copper have a nodular treatment on the surface thereof for better adhesion.

Another object of the present invention is to provide a method of forming a printed circuit board using a component as described above.

These and other objects and advantages will become apparent from the following description of preferred embodiments of the invention, taken together with the accompanying drawings.

BRIEF DESCRIPTION OF THE DRAWINGS

The invention may take physical form in certain parts and arrangement of parts, embodiments of which are described in detail in the specification and illustrated in the accompanying drawings, wherein.

DETAILED DESCRIPTION OF PREFERRED EMBODIMENT

Figure 1:
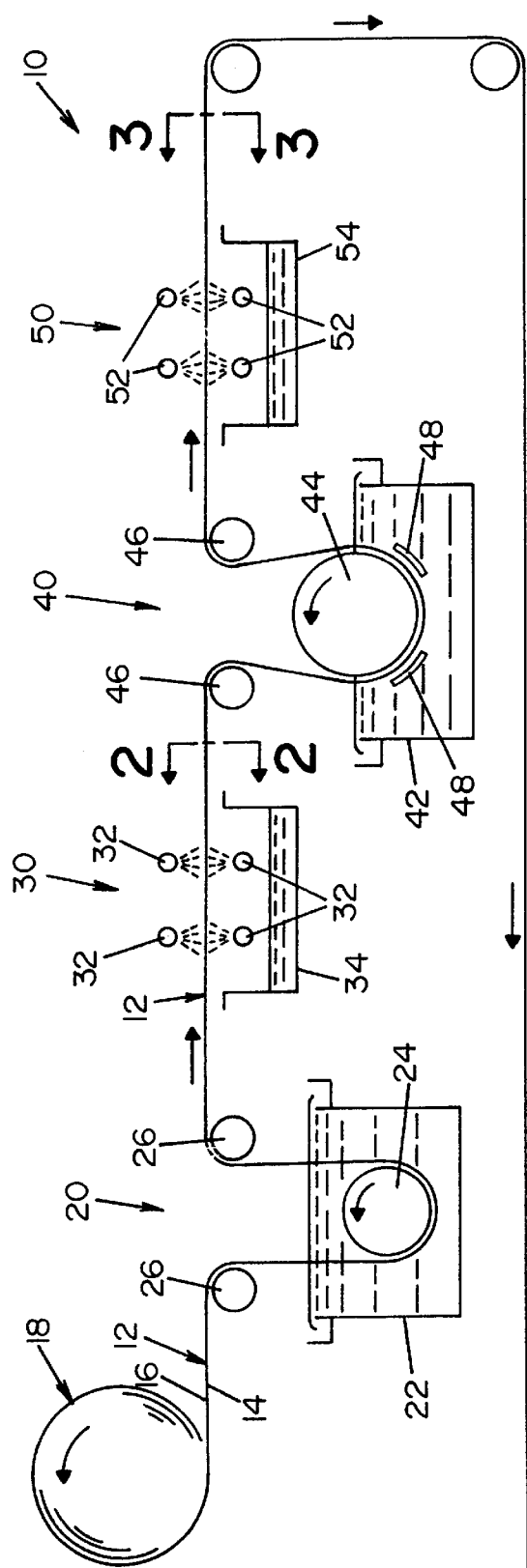
FIG. 1 is a schematic view of a process for forming a component in accordance with the present invention that is used in manufacturing printed circuits.
Figure 1:
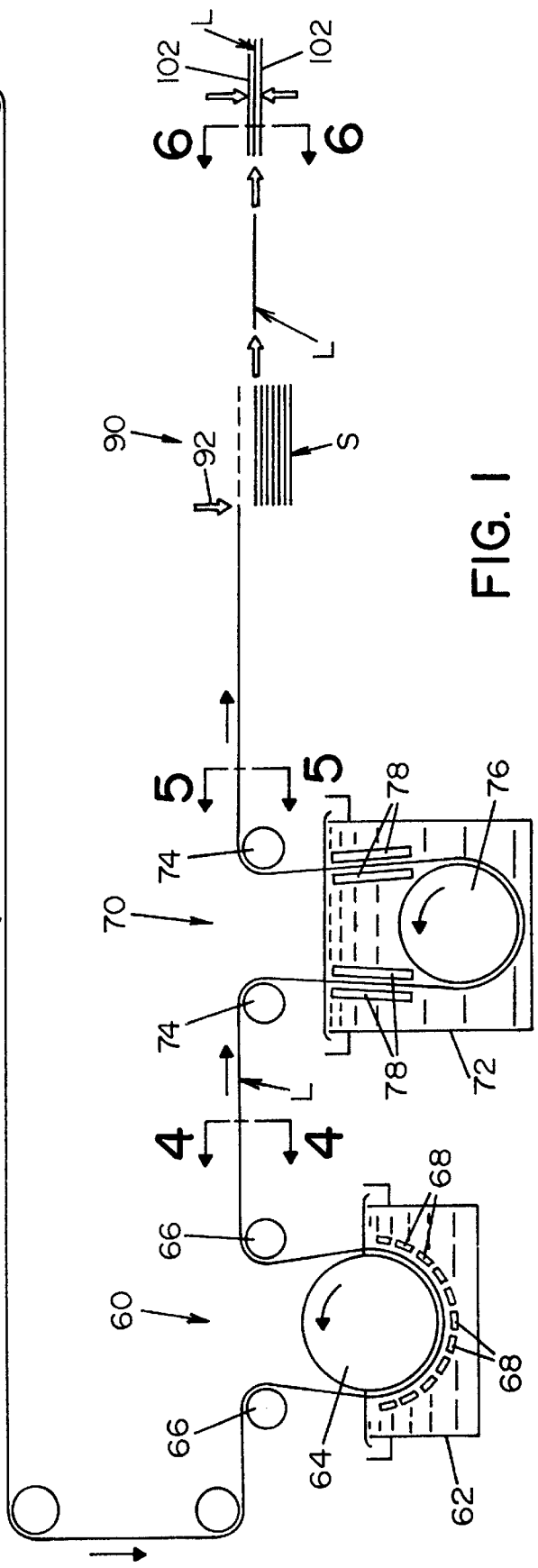
Figure 2:
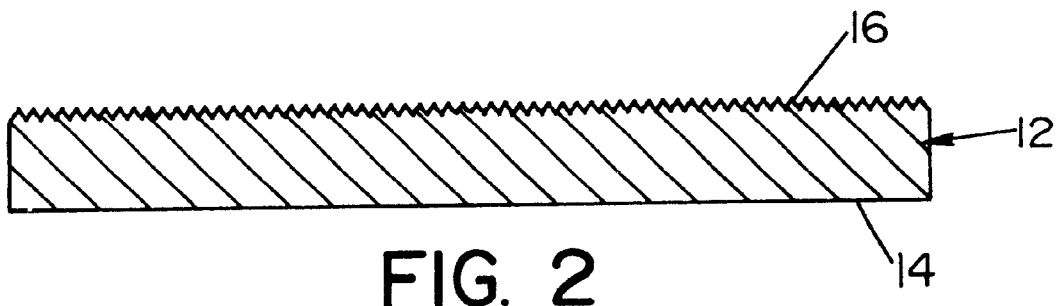
FIG. 2 is an enlarged sectional view taken along lines 2—2 of FIG. 1 showing a sheet of copper foil.

Referring now to the drawings wherein the showings are for the purpose of illustrating preferred embodiments of the invention only, and not for the purpose of limiting same, FIG. 1 is a schematic view of a manufacturing process 10 for forming a component L (best seen in FIG. 5), illustrating preferred embodiments in the present invention. In the embodiment shown, component L is formed from a generally continuous strip of copper foil 12 best seen in FIG. 2. FIG. 2 is an enlarged cross-sectional view of copper foil 12. The copper foil 12 has a shiny side 14 and a matte side 16. (In the drawings, matte side 16 of copper foil 12 is shown exaggerated for the purpose of illustration). In the embodiment shown, copper foil 12 is provided from a generally continuous roll 18. Copper foil 12 may be comprised of any copper foil suitable for use in a printed circuit board. It has been known to use copper foils up to about 75 $\mu$m thick in printed circuit boards. Accordingly, copper foil 12 may have a thickness of about 75 $\mu$m or less. In this respect, since copper foil 12 represents a useable element in forming a printed circuit board, it is preferable that copper foil 12 is as thin as possible, and preferably thinner than conventional 1 ounce copper foil (1 ounce copper foil has a thickness of about 35 $\mu$m). Because copper foils having a thickness of less than 12 $\mu$m are difficult to handle, copper foil 12 preferably has a thickness between 35 $\mu$m and 12 $\mu$m, i.e., is as thin as possible yet still thick enough to be manually handled and manipulated.

Copper foil 12 undergoes a first cleaning process, designated 20 in the drawings, to remove oxide film on the surfaces thereof. In the embodiment shown, copper foil 12 is conveyed into a tank 22 around a drum 24 by means of guide rollers 26. Tank 22 contains a cleaning solution to remove oxide film from the surfaces of copper foil 12. An acid solution is preferably used to remove the copper oxide layer from copper foil 12. A typical acid solution for cleaning copper foil 12 may include hydrochloric acid, sulfuric acid or nitric acid. In one embodiment, sulfuric acid is used to remove the copper oxide layer from copper foil 12.

In the embodiment shown, after cleaning process 20, copper foil 12 undergoes a rinsing process, designated 30, wherein spray elements 32 disposed above and below copper foil 12 spray the surfaces of copper foil 12 with water. A tank 34 disposed beneath spray elements 32 collects the water sprayed therefrom.

Following cleaning process 20 and rinsing process 30, copper foil 12 undergoes a release layer application process 40. In accordance with the present invention, a release layer 49 is applied to copper foil 12. Release layer 49 is comprised of a metal-containing material, such as a metal, a metal alloy or a metal oxide. Release layer 49 may be formed from nickel, a nickel/tin alloy, tungsten, tungsten oxide, titanium, titanium oxide, tantalum, tantalum oxide, vanadium, vanadium oxide, molybdenum, molybdenum oxide, chromium or chromium oxide. In the embodiment shown and hereinafter described, release layer 49 is formed of chromium. The chromium is applied to copper foil 12 by means of a plating process. As will be appreciated, materials that find advantageous application as release layer 49 may be applied by other types of processes. For example, metal release layers may be applied by vacuum deposition or sputter deposition processes. Oxides may be applied by a spraying process. These and other processes may be used without deviating from the present invention.

Figure 3:
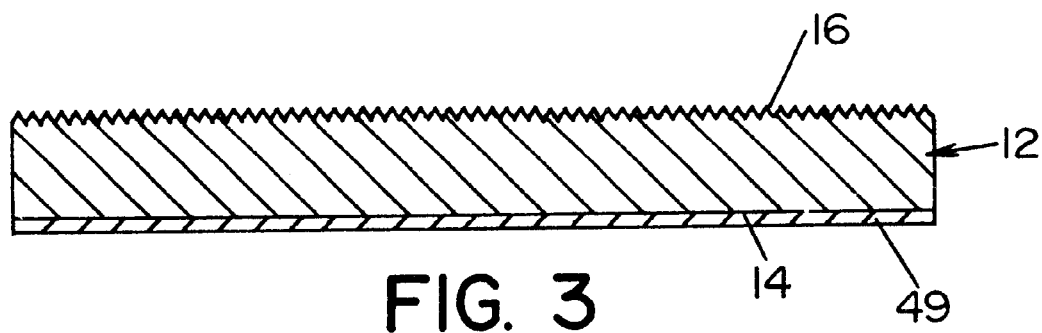
FIG. 3 is an enlarged sectional view taken along lines 3—3 of FIG. 1 showing the sheet of copper foil of FIG. 2 with a layer of chromium on one side thereof.

Referring now to the application process 40 shown in the drawings, copper foil 12 is directed into a tank 42 and around a drum 44 by guide rollers 46. Tank 42 contains a chromic acid solution. Copper foil 12 is oriented relative to guide rollers 46 and drum 44 such that only shiny side 14 of copper foil 12 is exposed to the chromic acid solution. (It will, of course, be appreciated from a further reading of this description that release layer 49 may alternately be applied to matte side 16). Anodes 48 are disposed around drum 44 to apply a current density to copper foil 12. Guide rollers 46 are cathodic rollers wherein chromium is deposited on the exposed shiny side 14 of copper foil 12 when anodes 48 are energized by a power source (not shown). Process 40 deposits chromium as release layer 49 on the shiny side 14 of copper foil 12. FIG. 3 is a cross-sectional view showing copper foil 12 with a chromium release layer 49 on shiny side 14 thereof.

Following chromium plating process 40, copper foil 12 with chromium release layer 49 thereon then undergoes a rinse process, designated 50 in the drawings. Spray elements 52, disposed above and below copper foil 12 and chromium release layer 49, spray water onto the surfaces of copper foil 12 and chromium release layer 49 to rinse and clean the same and to remove any residual chromic acid therefrom. A tank 54 disposed below spray nozzles 52 collects the rinsing solution.

Figure 4:
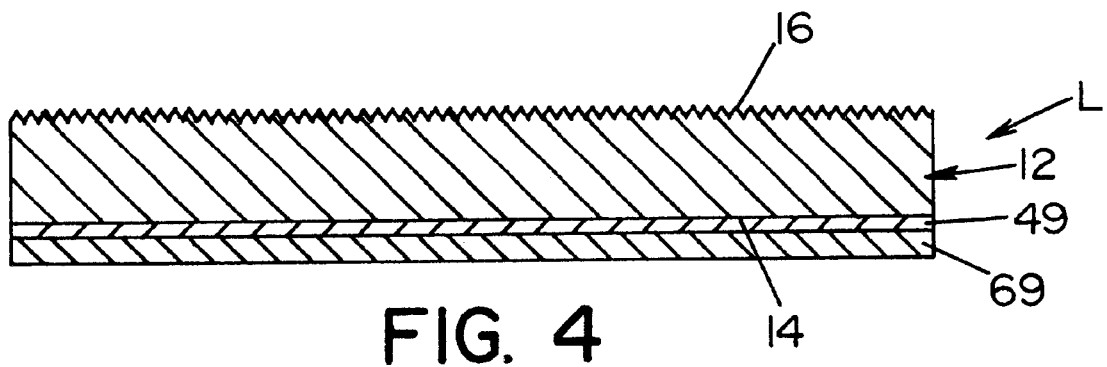
FIG. 4 is an enlarged sectional view taken along lines 4—4 of FIG. 1 showing a component for manufacturing printed circuits according to the present invention.

Copper foil 12 with a release layer 49 thereon then undergoes a copper deposition process 60. In the embodiment shown, copper foil 12 with chromium release layer 49 thereon is conveyed into a tank 62 containing an electrolytic solution. Copper foil 12 is guided around a drum 64 by cathodic guide rollers 66. Copper foil 12 is oriented so that only release layer 49 is exposed to the electrolytic solution within tank 62. Anodes 68 are disposed within tank 62 about drum 64. Anodes 68 are operable to electrodeposit copper from the electrolytic solution onto chromium release layer 49 when anodes 68 are energized by a power source (not shown). A copper layer 69 is deposited onto chromium layer 49. FIG. 4 is a cross-sectional view of component L, that is comprised of a copper foil 12, a layer of chromium 49 and a copper layer 69 formed on chromium layer 49.

Figure 5:
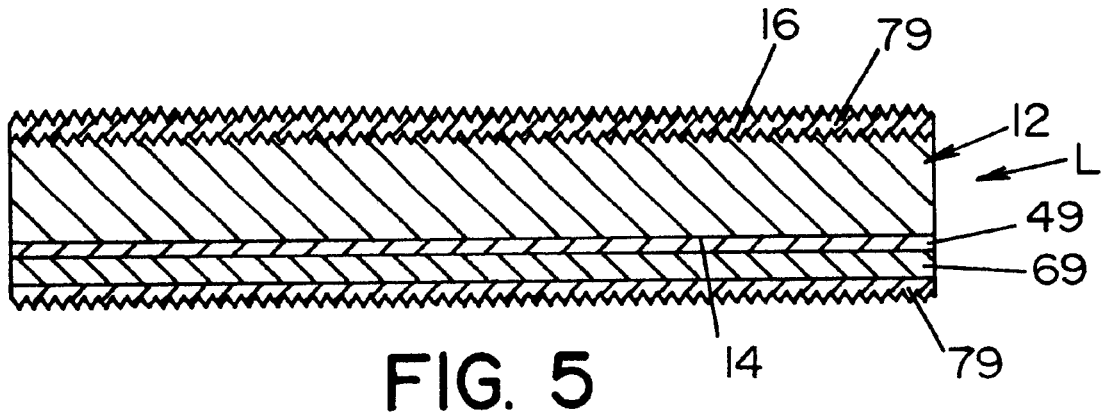
FIG. 5 is an enlarged sectional view taken along lines 5—5 of FIG. 1 showing the component of FIG. 4 with a surface treatment applied to one side thereof.

At this point, component L may undergo a nodular treatment, designated 70 in the drawings, to enhance the bonding characteristics and peel strength of component L when such component L is applied to a prepreg board. Nodular treatment process 70 is comprised of passing component L (comprised of copper foil 12, chromium release layer 49 and copper layer 69) through a coating tank 72. In the embodiment shown, component L is directed over cathodic guide rollers 74 around a drum 76. Anodes 78 are disposed within coating tank 72 on opposite sides of component L to electrically charge component L wherein a surface treatment 79 is applied to copper layer 69 and to matte side 16 of copper foil 12. FIG. 5 is a cross-sectional view of component L having a nodular layer 79 formed on copper layer 69. In the embodiment shown, both surfaces, i.e., copper layer 69 and copper foil 12, are exposed to nodular treatment process 70. It will, of course, be appreciated from further reading of the present specification, that only matte side 16 of copper foil 12 or only copper layer 69 may undergo a nodular treatment process to enhance the adhesive properties of only one side of component L without deviating from the present invention.

The nodular surface treatment may be of a type as described in U.S. Pat. No. 3,293,109 to Luce et al., the disclosure of which is expressly incorporated herein by reference.

Figure 6:
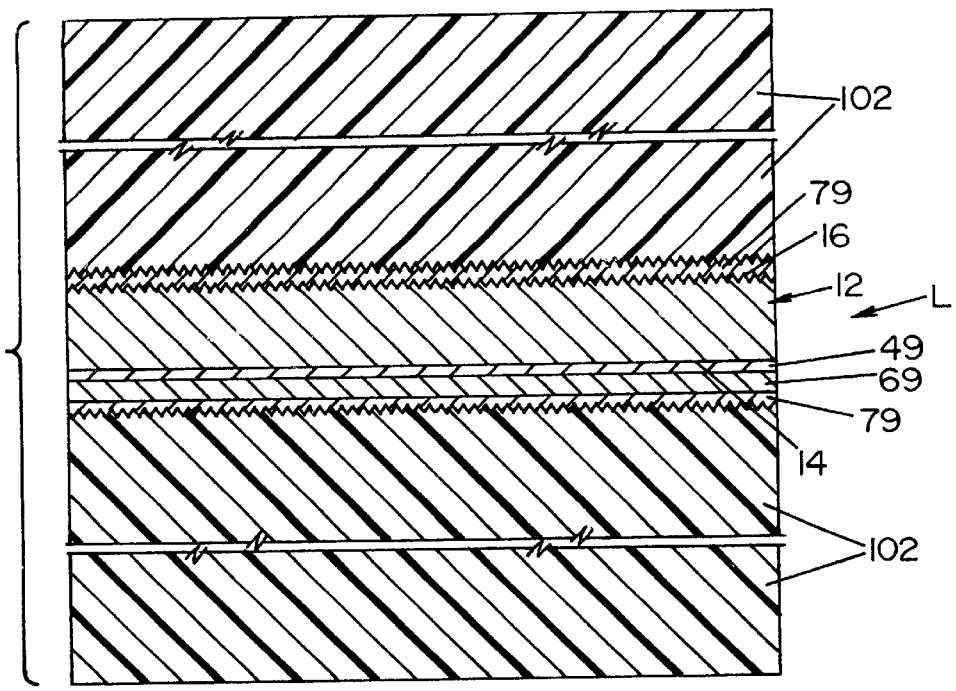
FIG. 6 is a cross-sectional view taken along lines 6—6 of FIG. 1 showing the component of FIG. 5 disposed between prepreg boards during a laminating process.

Component L then undergoes a shearing process, designated 90 in FIG. 1, wherein a knife edge 92 shears the generally continuous length of component L into sheets designated "S." FIG. 6 is a cross-sectional view of a sheet S.

Sheets S of component L are then available to a laminator for use in a lamination process for forming printed circuit boards. In a lamination process, component L is placed between two prepreg layers 102. FIG. 6 is a cross-sectional view of component L disposed between two prepreg layers 102. An adhesive material (not shown) is applied to prepreg layers 102 in a conventional manner to adhere prepreg layers 102 to component L, as is conventionally known. In a laminating process, prepreg layers 102 are bonded to the outer surfaces of component L. In the embodiment shown, one prepreg layer 102 is adhered to treatment layer 79 on matte side 16 of copper foil 12 and the other prepreg layer 102 is adhered to treatment layer 79 on copper layer 69. In a conventional lamination process, prepreg layers 102 and component L are heated and compressed to bond prepreg layers 102 to the respective surfaces of component L, as schematically illustrated by arrows in FIG. 1.

Figure 7:
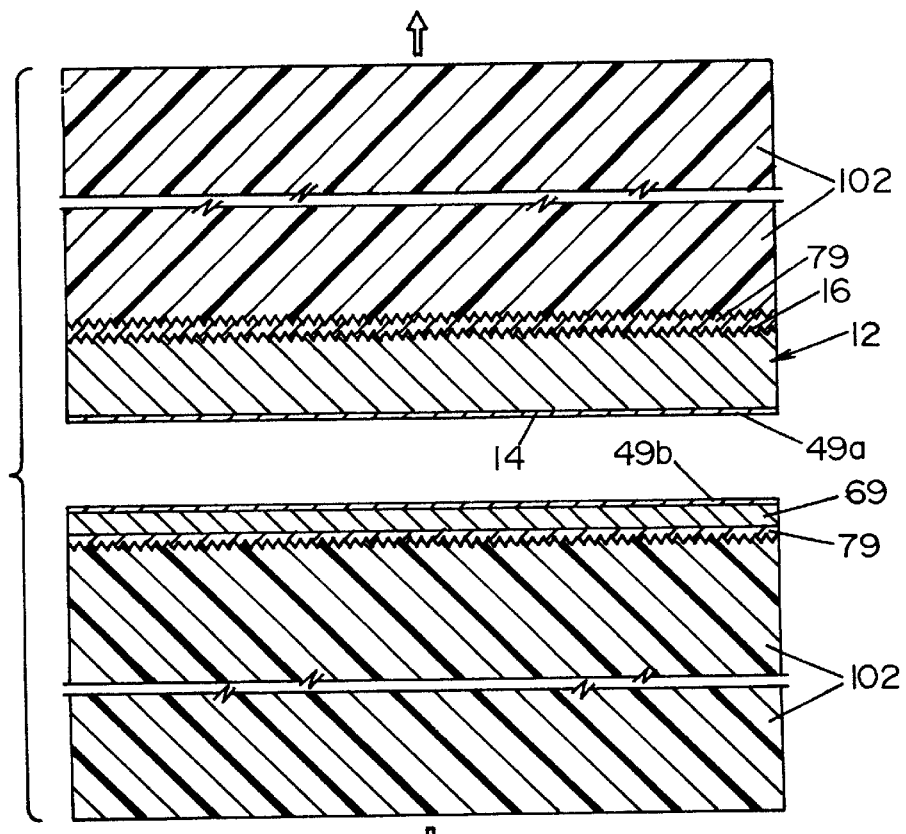
FIG. 7 is a cross-sectional view of a component according to the present invention after a laminating process.

In accordance with the present invention, following the lamination process, the respective prepreg layers 102 are separated from each other as shown in FIG. 7. When this occurs, chromium layer 49, that is disposed between copper foil 12 and copper layer 69, splits or separates with a portion 49a of chromium layer 49 remaining on copper foil 12 and a portion 49b of chromium layer 49 remaining on copper layer 69. In other words, the chromium layer 49 allows copper foil 12 and copper layer 69 to separate from each other, thereby providing two, essentially clean copper surfaces to allow fabrication of printed circuit boards by etching processes as heretofore briefly described.

In accordance with the present invention, the ultra-thin, chromium release layer 49 essentially separates with a portion 49a remaining on copper foil 12 and a portion 49b remaining on copper layer 69. Because chromium release layer 49 was extremely thin, preferably less than 0.10 $\mu$m (about 1,000 Å), only a very thin layer of chromium (about 400–600 Å) remains on either copper foil 12 or copper layer 69. These thin chromium layers 49a, 49b do not significantly affect etching processes used to form circuits from copper foil 12 or copper layer 69, thereby allowing etching of both surfaces without additional cleaning processes.

The present invention thus provides a component L and a method of forming the same that provides two usable layers of copper, one being conventional copper foil 12 and the other being an ultra thin copper layer 69. Both layers are usable elements in the formation of printed circuit boards. As will be appreciated, the extremely thin copper layer 69 facilitates finer, smaller circuit patterns than copper foil 12 for the reasons set forth above. Component L essentially provides two usable copper surfaces, both of which are clean and available for circuitizing. Still further, there is no discardable element or excess material. In this respect, copper foil 12 essentially acts as a carrier layer to facilitate application of thinner copper layer 69 (or a copper layer 69 of the same thickness as copper foil 12) thereon. Copper foil 12 still provides a suitable material for formation of printed circuits where extremely fine lines are not required.

The invention shall now be further described together with the following Example disclosing a specific process and resulting component.

EXAMPLE

A nominal 1 oz/ft² electrodeposited copper foil is exposed to an acid solution to remove any oxide film that may exist on the surface of the copper foil after electroforming. The acid solution is comprised of 50 g/l sulfuric acid. After cleaning and rinsing, the drum side (i.e., shiny side) of the copper foil 12 is cathodically electrolyzed in a 10 g/l chromic acid solution for 5 seconds at 10 amps/ft², rinsed. Chemical analysis shows that about 59 $\mu$g/dm² of chromium is deposited on the drum side of the foil.

Copper foil 12 is then transported into a copper sulfate plating electrolyte containing about 100 g/l $Cu^{+2}$ ions and about 60–80 g/l $H_2SO_4$. The electrolyte is preferably free of any additives. Copper foil 12 with chromium release layer 49 thereon is then plated at 400–1,000 amps/ft² for sufficient time to form a 5 $\mu$m thick layer of copper on chromium layer 49. After the 5 $\mu$m of copper plating, both copper surfaces (i.e., matte side 16 of copper foil 12 and the surface of copper layer 69) are plated with a nodular copper deposit to increase the surface area for bonding to component resins.

The resulting component L is comprised of about 1 oz/ft² copper foil 12, a chromium release layer 49, a 5 $\mu$m copper layer 69, with a nodular treatment layer 79 on both the 1 oz/ft² copper foil 12 and the 5 $\mu$m copper layer 69. Component L is transported to a lamination press where it is placed between layers 102 of epoxy prepreg. The prepreg/foil composite is subjected to heat and pressure sufficient to cure the prepreg and form the composite into a component.

Component L with 1 oz/ft² copper foil 12, a chromium release layer 49, a 5 $\mu$m copper layer 69, with a nodular treatment layer 79 on both the 1 oz/ft² copper foil 12 and the 5 $\mu$m copper layer 69, with resin bonded to the nodular treatment on both sides, is trimmed to remove any excess resin that flowed past the edge of the composite. Component L is then separated at the chromium release layer 49 exposing two pristine, clean copper surfaces that are free of contamination, dust and resin particles. The force adhesion holding the 5 $\mu$m copper layer 69 and the 1 oz. copper foil 12 together is measured to be less than 0.05 lb./in. after lamination.

The foregoing description is a specific embodiment of the present invention. It should be appreciated that this embodiment is described for purposes of illustration only, and that numerous alterations and modifications may be practiced by those skilled in the art without departing from the spirit and scope of the invention. For example, other concentration and processing times may be used to form the component heretofore described. It is intended that all such modifications and alterations be included insofar as they come within the scope of the invention as claimed or the equivalents thereof.

Having described the invention, the following is claimed:

1. A component for use in forming a printed circuit board, comprised of:
   a copper foil that represents a useable element in a printed circuit board to be formed;
   a layer of chromium on one surface of said copper foil, said layer of chromium having a thickness of less than about 0.10 $\mu$m;
   a layer of electrodeposited copper on said layer of chromium, said layer of electrodeposited copper being a useable element in a printed circuit board to be formed;
   a nodular treatment layer on said copper foil; and
   a nodular treatment layer on said layer of electrically deposited copper.

2. A component as defined in claim 1, wherein said copper foil is rolled copper foil.

3. A component as defined in claim 1, wherein said copper foil is electrodeposited copper foil having a shiny side and a matte side.

4. A component as defined in claim 3, wherein said chromium layer is applied to said shiny side of said electrodeposited foil.

5. A component as defined in claim 1, wherein said layer of chromium is about 0.03 $\mu$m.

6. A component as defined in claim 5, wherein said copper foil has a thickness of less than 35 $\mu$m.

7. A component as defined in claim 6, wherein said copper foil has a thickness of less than 20 $\mu$m.

8. A component for use in forming a printed circuit board, comprised of:
   a copper foil that represents a useable element in a printed circuit board to be formed;
   a metal-containing release layer on one surface of said copper foil, said metal-containing release layer having a thickness of up to about 0.10 $\mu$m;
   a layer of electrodeposited copper on said metal-containing release layer, said layer of electrodeposited copper being a useable element in a printed circuit board to be formed;
   a nodular treatment layer on said copper foil; and
   a nodular treatment layer on said layer of electrically deposited copper.

9. A component as defined in claim 8, wherein said metal-containing release layer is formed of a material selected from the group consisting of nickel, a nickel-tin alloy, tungsten, tungsten oxide, titanium, titanium oxide, tantalum, tantalum oxide, chromium, chromium oxide, vanadium, vanadium oxide, molybdenum and molybdenum oxide.

10. A component as defined in claim 9, wherein said release layer is formed of a metal.

11. A component as defined in claim 10, wherein said metal release layer is formed of chromium.

12. A component as defined in claim 11, wherein said layer of chromium is about 0.03 $\mu$m.

13. A component as defined in claim 11, wherein said copper foil is rolled copper foil.

14. A component as defined in claim 11, wherein said copper foil is electrodeposited copper foil having a shiny side and a matte side.

15. A component as defined in claim 10, wherein said copper foil has a thickness less than 35 $\mu$m.

16. A component as defined in claim 15, wherein said copper foil has a thickness of less than about 20 $\mu$m.

17. A method of forming a component for use in manufacturing printed circuits, comprising the steps of:
   (a) cleaning one surface of a copper foil by exposing a surface of a copper foil to an acid solution to remove oxide film from said surface;

(b) rinsing said surface to remove residual acid solution;
(c) electrolytically depositing a layer of chromium on said surface, said layer of chromium having a thickness less than about 0.10 μm;
(d) cleaning and drying said layer of chromium;
(e) electrodepositing of a layer of copper on said chromium layers; and
(f) applying a nodular treatment to said copper foil and to said layer of copper.

18. A method of forming printed circuits, comprising the steps of:
(a) applying a metal-containing release layer of material that is less than about 0.10 μm onto a clean surface of a copper foil;
(b) electrodepositing a layer of copper onto said metal-containing release layer;
(c) applying a nodular treatment to said copper foil and to said layer of copper;
(d) bonding said copper foil to a first prepreg layer and said layer of copper to a second prepreg layer; and
(e) separating said prepreg layers such that said copper foil separates from said layer of copper along said metal-containing release layer.

19. A method as defined in claim 18, further comprising etching both said copper foil and said layer of copper to form electronic circuit patterns thereon.

20. A method as defined in claim 18, wherein said metal-containing release layer is formed of a material selected from the group consisting of nickel, a nickel-tin alloy, tungsten, tungsten oxide, titanium, titanium oxide, tantalum, tantalum oxide, chromium, chromium oxide, vanadium, vanadium oxide, molybdenum and molybdenum oxide.

21. A method as defined in claim 20, wherein said metal release layer is formed of chromium.

22. A method as defined in claim 21, wherein said copper foil has a thickness of less than about 20 μm.

* * * * *